(12) United States Patent
Young

(10) Patent No.: US 6,462,469 B1
(45) Date of Patent: Oct. 8, 2002

(54) ELECTROLUMINESCENT DEVICE HAVING ELECTRICAL CONDUCTORS ARRANGED BETWEEN ADJACENT DISPLAY ELEMENTS

(75) Inventor: Nigel D. Young, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 230 days.

(21) Appl. No.: 09/588,385

(22) Filed: Jun. 6, 2000

(30) Foreign Application Priority Data

Jun. 25, 1999 (GB) .............................................. 9914801

(51) Int. Cl.$^7$ ........................... H05B 33/26; H05B 33/02
(52) U.S. Cl. ........................... 313/504; 313/500; 345/45
(58) Field of Search ......................... 313/498, 500–512; 315/169.1, 169.3; 345/55, 76, 45

(56) References Cited

U.S. PATENT DOCUMENTS

2002/0011783 A1 * 1/2002 Hosokawa et al. ......... 313/504

FOREIGN PATENT DOCUMENTS

| EP | 0717445 A2 | 6/1996 | ........... H01L/27/15 |
| JP | 10335068 | * 12/1998 | .............. G09F/9/30 |
| JP | 200231985 | * 8/2000 | ........... H05B/33/02 |
| WO | WO9636959 | 11/1996 | ............. G09G/3/30 |

\* cited by examiner

Primary Examiner—Nimeshkumar D. Patel
Assistant Examiner—Karabi Guharay

(57) ABSTRACT

In an electroluminescent display device having a plurality of display elements (12) each of which comprises a portion of a common organic electroluminescent (EL) layer (20) and first and second electrodes (18,22) on opposing sides of the EL layer, an electrical conductor (30) held at a predetermined potential is provided extending between the first electrodes (18) of adjacent display elements and in contact with the EL layer for sinking electrical current tending to flow laterally in the EL layer between the adjacent display elements. In an active matrix array device, the electrical conductors may be provided in the form of a grid extending around each display element pad electrode (18). In a passive matrix array device the electrical conductors may comprise conductor lines (50) extending between the address conductors (40) of one set.

5 Claims, 2 Drawing Sheets

ELECTROLUMINESCENT DEVICE HAVING ELECTRICAL CONDUCTORS ARRANGED BETWEEN ADJACENT DISPLAY ELEMENTS

BACKGROUND OF THE INVENTION

This invention relates to an electroluminescent display device having a plurality of electroluminescent display elements each comprising a portion of an organic electroluminescent layer common to all the display elements and first and second electrode layers arranged on opposing sides of the electroluminescent layer at the display element locations.

The display device may be a simple segmented display device, for example, for displaying simple icons. Alternatively, the device may comprise a matrix display device having an array of individually driveable display elements arranged in rows and columns. Such matrix display devices, which can be used for displaying information and video applications, may be of simple passive matrix form or of active matrix form in which each display element is controlled by an associated switch means, usually in the form of TFTs (thin film transistors). In a simple passive matrix display device, the electroluminescent (EL) layer is provided between crossing sets of row and column address conductors at their intersections thereby forming a row and column array of electroluminescent display elements. By virtue of the diode-like I-V characteristic of the electroluminescent display elements, each element is capable of providing both a display and a switching function enabling multiplexed drive operation. In an active matrix device the associated switch means is operable to supply a drive current to the display element so as to maintain its light output for a significantly longer period. Thus, for example, each display element circuit is loaded with an analogue (display data) drive signal once per field period in a respective row address period which drive signal is stored and is effective to maintain a required drive current through the display element for a field period until the row of display elements concerned is next addressed. Examples of active matrix electroluminescent display devices using thin film organic electroluminescent materials are described in EP-A-0717445.

The organic EL layers described in this particular reference are molecular organic material layers comprised of an organic hole injecting and transporting zone in contact with one of the electrodes (anode) and an electron injecting and transporting zone forming a junction with the hole injecting and transporting zone. The hole injecting and transporting zone can be of a single material or multiple materials and comprises a hole injecting layer in contact with the electrode and a contiguous hole transporting layer interposed between the hole injecting layer and the electron injecting and transporting zone. The electron injecting and transporting zone can similarly be formed of a single material or multiple materials, and comprises an electron injecting layer in contact with the other (cathode) electrode and a contiguous electron transporting layer interposed between the electron injecting layer and the hole injecting and transporting zone. Recombination of the holes and electrons, and luminescence, occurs within the electron injecting and transporting zone adjacent the junction. The layers are normally vapour deposited. The anode electrodes are formed of ITO which, being transparent, allows generated light to pass therethrough and has a suitably high work function. The anode electrodes in the array are provided as discrete pads arranged regularly in rows and columns and the electroluminescent layer extends as a continuous layer over the array of anodes. Overlying this layer, a continuous layer of low work function material such as calcium or a magnesium silver alloy is provided to form an electrode layer common to all display elements, portions of this layer immediately over the display element anode electrodes constituting the cathode electrodes.

The composition of the EL layer can, however, vary and it is known to use EL layers which for example, do not comprise specific hole injecting and electron injecting regions but rely instead solely on the electrodes for this purpose. The term EL layer used herein is intended to include these types as well.

More recently, light emitting polymers (LEPS) have been utilised for the electroluminescent layer. An example of an active matrix organic electroluminescent display device using LEP material is described in the paper by T. Shimoda et al entitled "Current Status and Future of Light-Emitting Polymer Display Driven by Poly-Si TFT" in SID 99 Digest, pages 372–375. The structure of an electroluminescent display element described therein comprises a layer of PPV (poly (p-phenylenevinylene)), an ITO anode electrode, a PEDOT-PSS (polyethylene dioxytiophene-polystyrene sulphonate) layer disposed between the PPV layer and the ITO mode, and a cathode electrode layer comprising Al—Li on the other side of the PPV layer. The PEPOT-PSS material used for the hole transport layer is said to enhance efficiency by an order of magnitude. As in the above-described device, the display element anodes are provided as discrete pad electrodes and the electroluminescent layer extends as a continuous layer over the entire area of the array. Similarly the cathode layer is provided as a continuous layer common to all display elements. An example of a passive matrix display device using LEP material is described in WO96/36959.

Problems can be experienced in operation of these kinds of electroluminescent display devices in the form of undesirable cross-talk effects whereby the driving of one display element can affect the operation of neighbouring display elements. For example, when one display element is turned on to emit light then neighbouring display elements which are supposed to be off may be seen to be partially emitting.

SUMMARY OF THE INVENTION

It is an object of the present invention to provide an improved electroluminescent display device in which such unwanted cross-talk effects are reduced.

According to the present invention, an electroluminescent display device of the kind described in the opening paragraph is characterised in that between the first electrodes of adjacent display elements an electrical conductor is provided in contact with the same side of the electroluminescent layer as the first electrodes which is held at a predetermined potential so as to sink electrical currents which flow laterally in the electroluminescent layer. The invention stems from a recognition that the organic electroluminescent layer, or at least components thereof, particularly the charge injecting/transporting regions when present, can be slightly conductive, and that electrical currents may flow laterally in this layer between the respective first electrodes of adjacent display elements in certain circumstances which lead to unwanted cross-talk effects between the adjacent display elements. The electrical conductor provided between the adjacent electrodes, and serving as a current sink, prevents electrical current flowing in this manner between adjacent display elements.

The electrical conductor can conveniently be formed at the same time as the first electrodes of the display elements by appropriately patterning a deposited conductive layer used for the first electrodes.

In the case of an active matrix electroluminescent display device in which the display element first electrodes comprise respective individual pad electrodes, the electrical conductor is preferably arranged to extend around the periphery of the first electrode, in the manner of a guard ring for example, to prevent current flowing laterally in the EL layer between adjacent display element first electrodes in both the row direction and the column direction. The electrical conductors required for the array of first electrodes may conveniently be provided in the form of a grid of electrically conductive material extending, preferably completely, around the individual pad electrodes. This grid can easily be formed at the same time as the pad electrodes by photolithographic patterning of a single deposited conductive layer used to form the pad electrodes, for example of ITO where the pad electrodes comprise the anodes. The continuous EL layer subsequently provided then extends over, and in contact with, both the pad electrodes and the grid, and with the hole transporting sub-layer component, if present, directly contacting the grid as well as the pad electrodes.

In the case of a passive matrix electroluminescent display devices, comprising crossing sets of parallel conductor strips, constituting respectively first and second electrodes of the display elements, with the EL layer extending there between, then the electrical conductor preferably comprises part of a conductive line extending between an adjacent pair of conductor strips of the set providing the display element first electrodes. Thus, where for example the conductor strips comprise the column conductors, a single conductive line serves to provide the electrical conductors between the first electrodes in two adjacent columns of display elements. Again, the required conductive lines can conveniently be provided at the same time as the first electrodes, i.e the one set of conductor strips, by appropriately patterning photolithographically a deposited conductive layer used to provide that set of conductor strips, and may for example comprise ITO where the set of conductor strips comprise the display element anode electrodes. A similar approach can be used to provide conductive lines between adjacent pairs of the other set of conductor strips as well.

BRIEF DESCRIPTION OF THE DRAWINGS

Embodiments of electroluminescent display devices in accordance with the present invention will now be described, by way of example, with reference to the accompanying drawings, in which.

It will be appreciated that the figures are merely schematic and have not been drawn to scale. The same reference numerals are used throughout the figures to denote the same or similar parts.

DETAILED DESCRIPTION OF THE PREFERRED EMBODIMENTS

Figure 1:
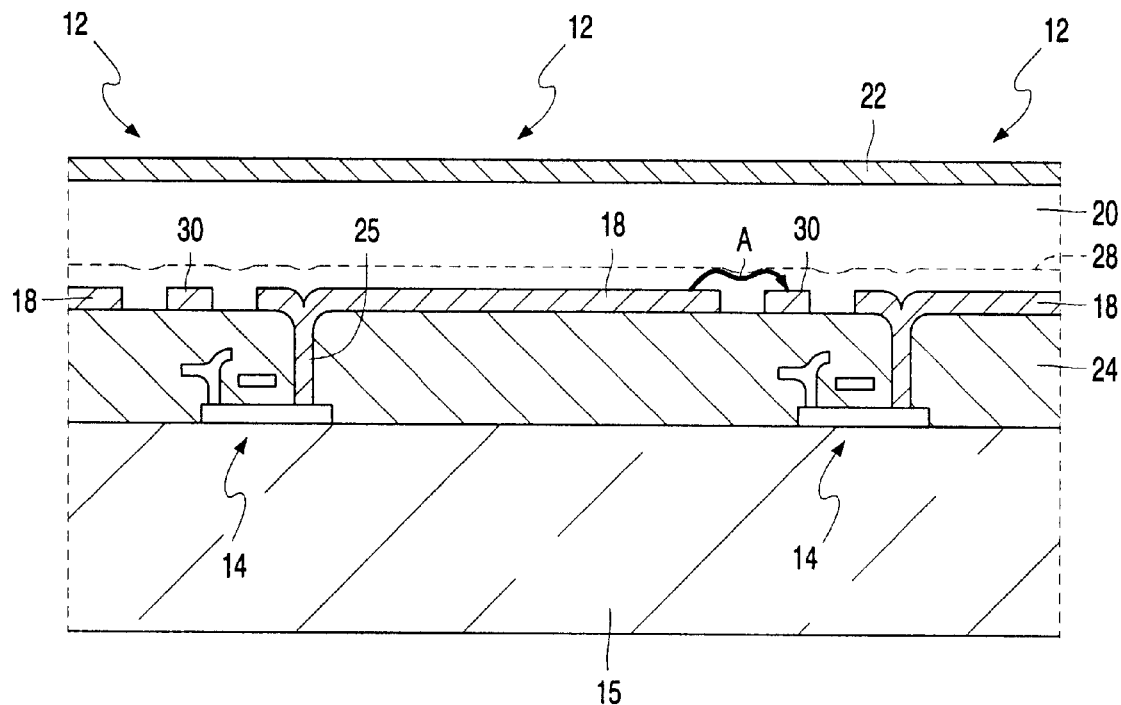
FIG. 1 is a schematic cross-sectional view through part of an active matrix organic electroluminescent display device in accordance with the invention.

Referring to FIG. 1, there is shown, schematically and in simplified form, a section through part of the active matrix electroluminescent display device whose structure is similar in many respects to known kinds, for example as described in previously-mentioned EP-A-0717445 and the paper by Shimoda et al to which reference is invited for general details of the construction and driving of such display devices and whose disclosures in this respect are incorporated herein. Briefly, and as shown in FIG. 1, the device comprises an array of display elements 12 arranged in rows and columns. The sectional view of FIG. 1 is taken along a row of display elements and shows one complete display element 12 and parts of two adjacent display elements in the same row. Each display element comprises an electroluminescent, or light emitting diode, display element and is associated with a control device in the form of a TFT (thin film, transistor), here shown in simple form and referenced generally at 14, which controls the supply of a drive current to the display element, and hence its operation. The TFT array is carried on a transparent insulating substrate 15, for example of glass or a synthetic material, together with associated sets of row and column address conductors via which drive signals are applied to the TFTs, and display element current supply lines.

Each display element 12 comprises a first electrode 18 in the form of a discrete rectangular pad, a respective overlying portion of a continuous organic electroluminescent layer 20 common to all display elements in the array, and a second electrode comprising a respective overlying portion of a continuous electrode layer 22, again common to all display elements in the array. The electrodes 18 are carried on a transparent insulating layer 24, for example of silicon oxide, which covers the active matrix circuitry comprising the TFTs and their associated sets of addressing conductors and each electrode 18 is connected to a current-carrying terminal of its associated control TFT 14 through a via 25 in the insulating layer. The electrodes 18 constitute the anodes of the display elements and are formed of a high work function, transparent conductive material such as ITO for injecting holes into the layer 20. The layer 22 constituting the second electrodes is of a low work function conductive material suitable for injecting electrons into the EL layer 20, for example a magnesium silver alloy. In operation, with the associated TFT 14 turned on, holes and electrons are injected into the organic EL layer 20, with electrical current flowing from the anode electrode 18 to the cathode electrode 20 of the display element, which holes and electrons recombine in the layer 20 generating light emission which passes through the transparent anode and the substrate 15 to be visible to a viewer.

The organic EL layer 20 can be of various known kinds. Particular examples of the composition of molecular and polymer types of such are described in the aforementioned EP-A-0717445 and the paper by Shimoda et al but, as will be apparent to persons skilled in the art, other known organic electroluminescent layer compositions can also be utilised.

As discussed in EP-A-0717445 the electroluminescent layer includes a hole transportation zone towards its side closest to the anode electrode 18 and an electron transportion zone facing the cathode layer 22. The EL layer 20 may include a hole injecting region of organic material between the hole transporting region and the anode electrode 18, as also described in EP-A-0717445. The material of the hole transporting region can comprise an aromatic tertiary amine and the luminescent electron transporting region can contain a metal oxinoid compound, examples of which are described in that specification, although other organic electroluminescent layer compositions known in the art could be used instead. For example, in an alternative display element structure, the layers may comprise, in order, the ITO anode, a hole transporting layer, an emission layer comprising a diphenyl vinylene (DPV) type host and fluorescent dopant material, an electron transporting layer comprising tris (8-hydroxyquinolene) aluminium ($Alq_3$), and a magnesium silver alloy cathode. In another known example, the display element structure may comprise the ITO anode, a hole transporting layer comprising a triphenylamine derivative (MTDATA), a luminescent layer comprising a compound formed by doping a diamine derivative with rubrene, an electron transporting layer comprising $Alq_3$, and a magnesium indium alloy cathode. As discussed in the paper by Shimoda et, the electroluminescent layer may comprise PPV and PEDOT-PSS as a hole transporting region adjacent the anode electrode.

In FIG. 1, a hole transporting/injecting region, or sub-layer, in the EL layer 20 is indicated at 28 by a dotted line.

It has been determined that the presence of such a hole injecting/transporting sub-layer can lead to undesirable cross-talk effects between adjacent display elements. Because the materials used for such purposes are slightly conductive, then in some situations of driving the display elements a small electrical current can flow from one display element electrode 18 to an adjacent display element laterally though this material in operation of the device causing drive current errors in the adjacent display element. Considering, for example, a situation in which one display element is turned on to emit light, with the common cathode electrode 22 being held at, say 5V and the anode electrode 18 of the display element concerned being at, say, 10V, and an adjacent display element is intended to be off (non-emitting), then the anode electrode 18 of the adjacent display element will at a potential of around 5V. As a consequence, some electrical current will tend to flow laterally in the layer 20 between the anode electrode 18 of the display element and the adjacent display element which can cause that element to emit some light as well.

In order to avoid, or at least reduce, this effect, electrical conductors are arranged between adjacent display element electrodes 18 which conductors are held at a predetermined potential level, for example ground, (negative with respect to the anode potential) and serve to sink such lateral electrical currents. The electrical conductors, shown at 30 in FIG. 1, comprise strips of conductive material spaced slightly from the electrodes and extending between, and parallel with, the facing edges of two adjacent electrodes 18. Thus, electrical currents flowing from a display element anode electrode 18 laterally in the layer 20 are prevented from reaching the adjacent electrode 18 in the row and instead flow into the conductive strip 30, as is indicated by the arrow A, thereby avoiding cross-talk in the row direction.

The conductive strips are arranged also to extend between the facing edges of the anode electrodes 18 of adjacent pairs of display elements in the column direction similarly to prevent cross-talk currents flowing between adjacent electrodes 18 in this direction. The conductive strips associated with the array of display elements are preferably formed in a grid pattern, with each grid cell enclosing a respective anode electrode 18, as shown more clearly in FIG. 2 which is a schematic plan view of a small part of the array. As is apparent from FIG. 2, the grid constituting the conductive strips 30 comprises interconnected conductive lines running in the row and column directions, between adjacent rows and columns of display elements, and each anode electrode 18 is completely surrounded by portions of the grid effectively making a current sinking protective guard ring around the electrode.

The grid is simply and conveniently fabricated at the same time as the array of electrodes 18. After fabricating the TFT matrix array and providing the insulating layer 24, with the required contact vias 25, on the substrate 15 using standard thin film deposition and patterning techniques, for example as described in the aforementioned publications, a layer of ITO is deposited continuously over the entire surface of the layer 24. This layer is then patterned using a known photolithographical definition process to leave the array of discrete anode electrodes 18 and the grid of conductive strips 30 extending therebetween. Thereafter the electroluminescent layer 20 is deposited over this structure so as to contact directly with the electrodes 18 and the grid, followed by the deposition of the continuous cathode electrode 22.

Figure 2:
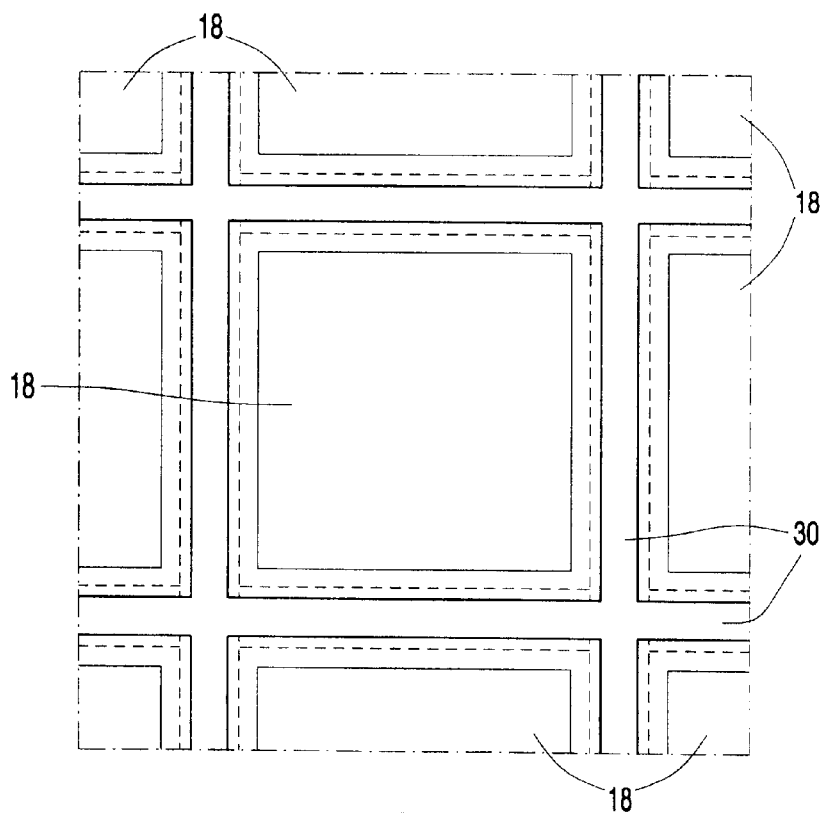
FIG. 2 is a schematic plan view of a part of the device of FIG. 1.

As is also shown in FIG. 2, the row and column lines of the grid may be arranged to overlie the row and column address conductors, shown in dotted outline, associated with the TFT array. Alternatively, however, they could be slightly displaced with respect to these conductors.

Of course, the anode and cathode electrodes of the display elements could be interchanged with the layer 22 then comprising the transparent, ITO, anode electrode enabling light emission to be viewed instead from above. In this case, the conductive grid, 30, can be formed from the cathode (18) electrode material and in use will be connected to an appropriate potential.

Figure 3:
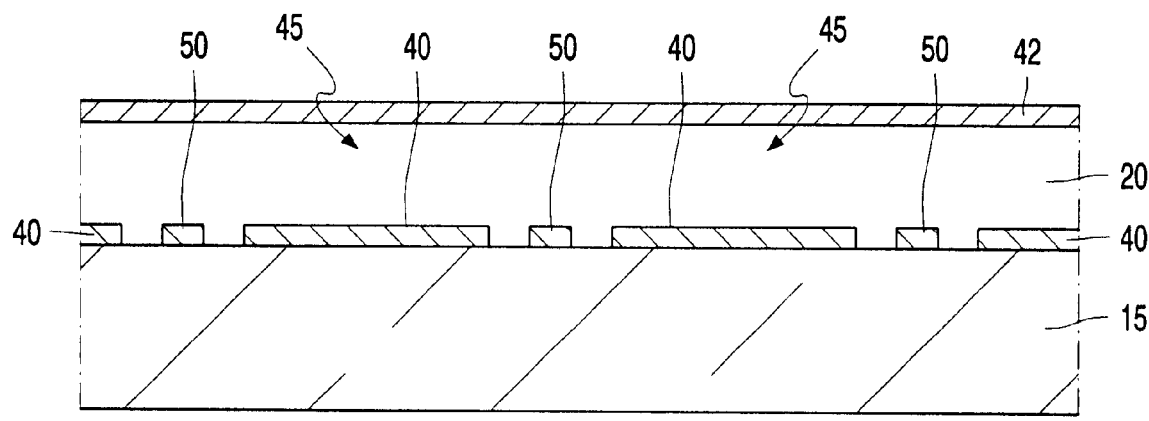
FIG. 3 is schematic cross-sectional view through part of a passive matrix organic electroluminescent display device according to the invention.
Figure 4:
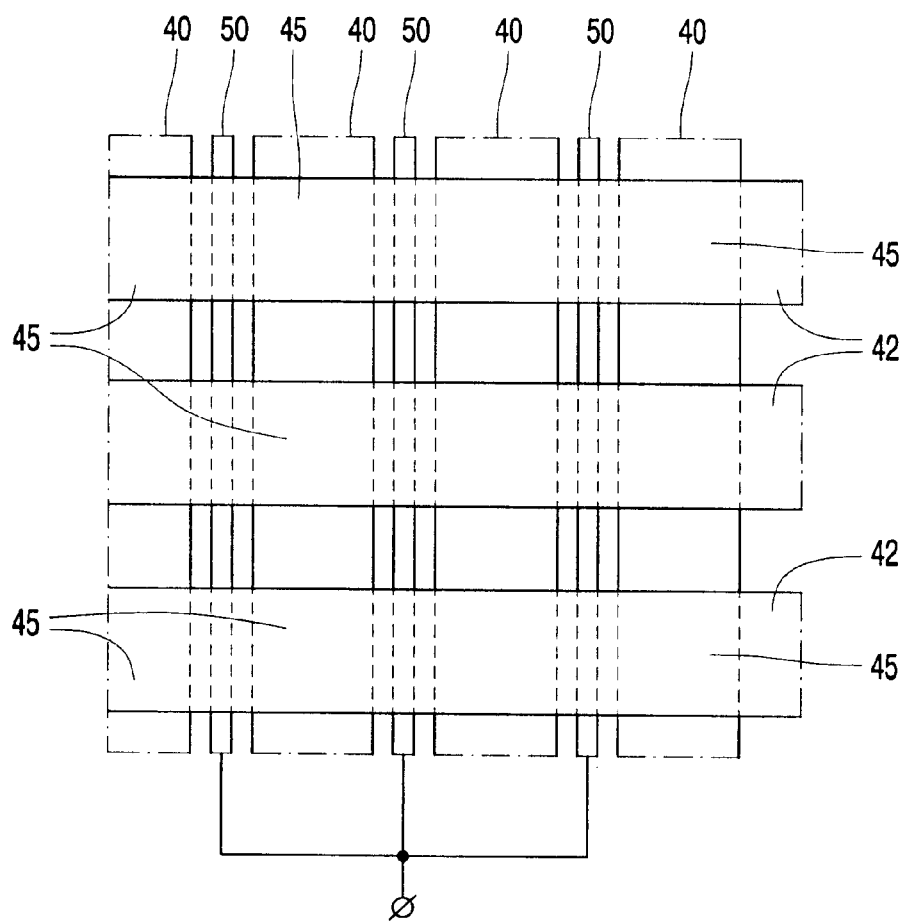
FIG. 4 is a schematic plan view of part of the device of FIG. 3.

FIGS. 3 and 4 illustrate an embodiment of a simple passive matrix electroluminescent display device similarly using current sinking, crosstalk preventing, electrical conductors, and show respectively schematic sectional and plan views of a typical part of the device. The device comprises a first set of parallel, regularly-spaced, column conductor strips 40 carried on the surface of the substrate 15, an organic electroluminescent layer 20 extending continuously over the entire area of the substrate and covering the set of conductor strips 40 and intervening regions of the substrate, and a second set of parallel, regularly-spaced, row conductor strips 42 deposited on the surface of the layer 20 and crossing the set of column conductor strips 40. At each cross-over between a column conductor and a row conductor strip a respective electroluminescent display element 45 is defined, with each display element 45 comprising respective portions of a column and a row conductor strip, acting respectively as first and second display element electrodes, and a portion of the electroluminescent layer 20 sandwiched therebetween. The column and row conductor strips 40, 42 constitute data and selection conductors respectively for driving the display elements and also the anode (hole injecting) and cathode (electron injecting) electrodes of the individual display elements 45. The column conductor strips 40 are formed of a suitable transparent conductive material having a high work function, preferably ITO, and the row conductor strips 42 comprise a suitable low ohmic, low work function material such as calcium, a magnesium silver alloy, an aluminium lithium alloy or other material known in the art which can be patterned as required. The organic electroluminescent layer 20 again may comprise a molecular electroluminescent material or a light emitting polymer material as previously described, and can include a hole transporting region immediately overlying the ITO column conductor strips.

In this device, the electrical conductors for sinking electrical currents flowing laterally in the layer 20 are arranged to prevent current flowing from the anode electrode of one display element 45 to the anode electrode of an adjacent display element in the row direction. The electrical conductors are provided in the form of conductive lines 50, each of which extends continuously between, and parallel with, a respective adjacent pair of column conductor strips 40 and constitutes a guard line spaced between two adjacent columns of display elements. The lines may be interconnected at their ends to enable the required predetermined potential level to be applied conveniently.

In similar manner to the previous embodiment, the conductive lines 50 are easily provided by appropriately patterning a deposited layer ITO used for the set of column conductor strips 40 at the same time as defining those conductor strips.

Conductive lines can similarly be provided extending between adjacent row conductor strips 42 directly on the other side of the EL layer 20 and connected in use to an appropriate predetermined potential so as to sink as well any currents tending to flow laterally in the layer 20 between adjacent row conductor strips, particularly in the case of the layer having an electron transport and/or injection region at its upper side, and prevent cross-talk caused by such. Again, these conductive lines can be provided simply by appropriate patterning of a deposited layer used to form the row conductor strips 42.

With regard to both embodiments, the guard rings and guard lines constituted by the conductive strips will inevitably sink some current in operation of the display device. However, current flow will predominantly be directly between the anode and cathode electrodes of the display elements and the amount of current dissipated in this way will in comparison be insignificant.

It will be appreciated that the current-sinking electrical conductors provided between adjacent display element electrodes will be of benefit in any type of organic electroluminescent display device in which a common EL layer is used for individual display elements and in which the EL layer, or at least a component region thereof next to the electrodes, is sufficiently conductive to allow some lateral electrical conduction.

From reading the present disclosure other modifications will be apparent to persons skilled in the art. Such modifications may involve other features which are already known in the field of heated cathodes and component parts thereof and which may be used instead of or in addition to features already described herein.

What is claimed is:

1. An electroluminescent display device having a plurality of electroluminescent display elements each comprising a portion of an organic electroluminescent layer common to all the display elements and first and second electrode layers arranged on opposing sides of the electroluminescent layer at the display element locations, characterised in that between the first electrodes of adjacent display elements an electrical conductor is provided in contact with the same side of the electroluminescent layer as the first electrodes which is held at a predetermined potential so as to sink electrical currents which flow laterally in the electroluminescent layer.

2. An electroluminescent display device according to claim 1, characterised in that the electrical conductor and the display element first electrodes comprise parts of a common conductive layer.

3. An electroluminescent display device according to claim 1, characterised in that the device comprises an active matrix display device having an array of display elements in which each display element first electrode comprises a respective pad electrode and in that the electrical conductor is arranged to extend around the periphery of the pad electrode.

4. An electroluminescent display device according to claim 3, characterised in that the electrical conductors extending between adjacent display element first electrodes in the array are provided in the form of a grid respective portions of which completely surround each pad electrode.

5. An electroluminescent display device according to claim 1, characterised in that the device comprises a passive matrix display device having crossing sets of parallel conductor strips, constituting respectively first and second electrodes of the display elements, with the electroluminescent layer extending therebetween, and in that the electrical conductor between adjacent display element first electrodes comprises a part of a conductive line extending an adjacent pair of conductor strips of the set providing the display element first electrodes.

* * * * *